(12) United States Patent
Dawson et al.

(10) Patent No.: US 6,399,493 B1
(45) Date of Patent: Jun. 4, 2002

(54) METHOD OF SILICIDE FORMATION BY SILICON PRETREATMENT

(75) Inventors: Robert Dawson, Austin; Jon D. Cheek, Round Rock; John G. Pellerin, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/860,141

(22) Filed: May 17, 2001

(51) Int. Cl.[7] .............................................. H01L 21/44
(52) U.S. Cl. ....................... 438/682; 438/683; 438/586; 438/592
(58) Field of Search ................................ 438/682, 683, 438/586, 592

(56) References Cited

U.S. PATENT DOCUMENTS

| | | | | |
|---|---|---|---|---|
| 5,344,793 A | * | 9/1994 | Zeininger et al. | 438/682 |
| 5,899,720 A | * | 5/1999 | Mikagi | 438/683 |
| 6,093,646 A | * | 7/2000 | Kuo et al. | 438/683 |
| 6,150,249 A | * | 11/2000 | Lee et al. | 438/592 |
| 6,150,266 A | * | 11/2000 | Lin et al. | 438/682 |
| 6,265,271 B1 | * | 7/2001 | Thei et al. | 438/682 |
| 6,304,177 B1 | * | 10/2001 | Nigro, Jr. et al. | 340/542 |

OTHER PUBLICATIONS

Stanley Wolf and Richard N. Tauber; *Silicon Processing for the VLSI Era, vol. 2—Process Integration*; pp. 144–152; 1990.

* cited by examiner

*Primary Examiner*—John F. Niebling
*Assistant Examiner*—Lynne A. Gurley
(74) *Attorney, Agent, or Firm*—Timothy M. Honeycutt

(57) ABSTRACT

Various methods of fabricating a silicide film and structures incorporating the same are provided. In one aspect, a method of fabricating a silicide film is provided that includes providing a silicon surface and etching the silicon surface at between isotropic and anisotropic etching conditions to define a plurality of oblique surfaces thereon and thereby increase the surface area of the silicon surface. A silicide-forming material is deposited on the plurality of oblique surfaces and the silicon surface is heated to react the silicide-forming material therewith and form silicide. The roughing of the silicon surface facilitates metal-silicide reactions.

22 Claims, 2 Drawing Sheets

METHOD OF SILICIDE FORMATION BY SILICON PRETREATMENT

BACKGROUND OF THE INVENTION

1. Field of the Invention

This invention relates generally to semiconductor processing, and more particularly to methods of fabricating a silicide structure.

2. Description of the Related Art

The interconnections between circuit structures in a semiconductor device frequently require the fabrication of contact structures. Where the circuit structures are implemented in silicon, as is commonly the case for impurity regions or gate electrodes, the interfaces between such circuit structures and the contacts typically exhibit relatively high series sheet resistances. The resistances can lead to undesirably high power consumption and lower circuit performance in integrated circuits. One method in use for years to reduce the series resistance of these types of structural interfaces involves the fabrication of metal-silicide layers on sources and drains, and on gate electrodes where polysilicon is the material of choice. Self-aligned silicidation ("salicidation") is perhaps the most common application of this method.

In conventional salicidation, a metal capable of reacting with silicon, such as titanium or cobalt, is deposited on the gate, the sidewall spacers, if any, and the impurity or source/drain regions. A one or two step anneal is performed to react the metal with the polysilicon of the gate and the silicon of the source and drain regions to form silicide. Following the anneal, an etch is performed to remove any unreacted metal.

The improvements in sheet resistance due to silicidation are dependent upon the quality of the silicide film. Film quality is, in-turn, largely a function of film geometry. Wider and thicker silicide films generally have lower resistance. Moreover, wider silicide films lessen the chances that a misaligned contact structure will fail to make contact directly with the underlying silicon or polysilicon. Titanium silicide reactions tend to be self-limiting in the vertical direction. Thus, titanium-silicide films often form to a shallower depth in a silicon substrate than desired. Lateral titanium silicide growth on polysilicon gates is similarly limited. In many cases, a titanium silicide film will only form on two thirds of the width of a poly gate. Cobalt exhibits fewer growth kinetics limitations than titanium. With either material, higher anneal temperatures can lessen the growth kinetics limitations, but at a cost in terms of thermal budget consumption. Furthermore, higher temperatures can cause localized deep silicide penetration that can lead to pn junction penetration.

One limitation on growth kinetics is thought to arise from the topography of the silicon-to-refractory metal interface. If the surface area of the underlying silicon or polysilicon structure could be increased, the silicide reaction rate should increase and result in more extensive silicide films.

The present invention is directed to overcoming or reducing the effects of one or more of the foregoing disadvantages.

SUMMARY OF THE INVENTION

In accordance with one aspect of the present invention, a method of fabricating a silicide film is provided that includes providing a silicon surface and etching the silicon surface at between isotropic and anisotropic etching conditions to define a plurality of oblique surfaces thereon and thereby increase the surface area of the silicon surface. A silicide-forming material is deposited on the plurality of oblique surfaces and the silicon surface is heated to react the silicide-forming material therewith and form silicide.

In accordance with another aspect of the present invention, a method of fabricating a circuit device is provided that includes providing a silicon surface, forming a gate electrode stack on the substrate and forming sidewall spacers adjacent to the gate electrode stack. The silicon surface is etched at between isotropic and anisotropic etching conditions to define a plurality of oblique surfaces thereon and thereby increase the surface area of the silicon surface. A silicide-forming material is deposited on the plurality of oblique surfaces and the silicon surface is heated to react the silicide-forming material therewith and form silicide.

In accordance with another aspect of the present invention, a method of fabricating a circuit device is provided that includes providing a silicon surface, forming a gate electrode stack on the silicon surface and forming a first pair of sidewall spacers adjacent to the gate electrode stack. A second pair of sidewall spacers is formed adjacent to the first pair of sidewall spacers. The silicon surface is etched at between isotropic and anisotropic etching conditions to define a plurality of oblique surfaces thereon and thereby increase the surface area of the silicon surface. A silicide-forming material is deposited on the plurality of oblique surfaces and the silicon surface is heated to react the silicide-forming material therewith and form silicide.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
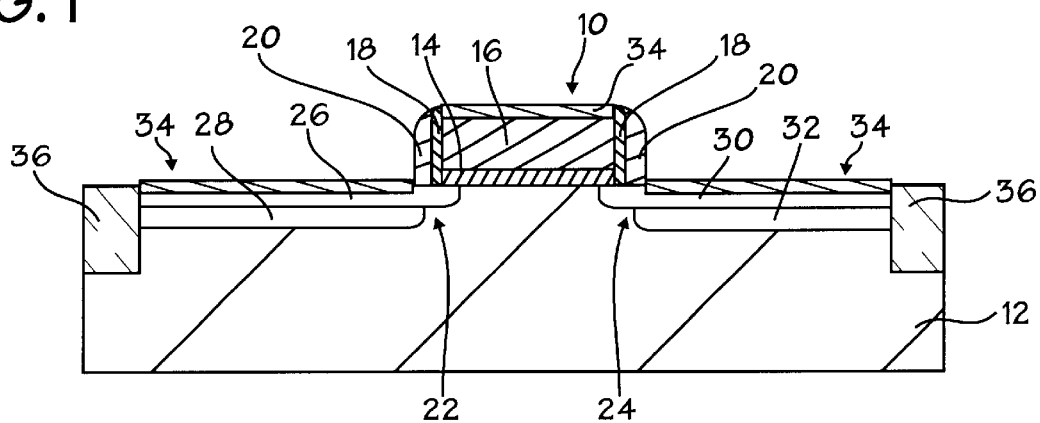
FIG. 1 is a cross-sectional view of an exemplary embodiment of a transistor device fabricated on a semiconductor substrate in accordance with the present invention.

In the drawings described below, reference numerals are generally repeated where identical elements appear in more than one figure. FIG. 1 is a cross-sectional view of an exemplary embodiment of a transistor device 10 fabricated on a semiconductor substrate 12 in accordance with the present invention. The transistor 10 includes a gate dielectric layer 14 fabricated on the substrate 12 and a gate electrode 16 fabricated on the gate dielectric layer 14. The gate electrode 16 and the gate dielectric layer 14 are bracketed by respective pairs of insulating sidewall spacers 18 and 20. Source/drain regions 22 and 24 are provided in the substrate 12. The source/drain region 22 consists of a source/drain extension region 26 and an overlapping impurity region 28. The source/drain region 24 similarly consists of a source/drain extension region 30 and an overlapping impurity region 32. Enhanced ohmic contact to the source/drain regions 22 and 24 and the gate electrode 16 is provided by a silicide layer 34. As described below, the silicide layer 34 is provided through an improved process in accordance with the present invention. Device isolation is provided by isolation structures 36.

Figure 2:
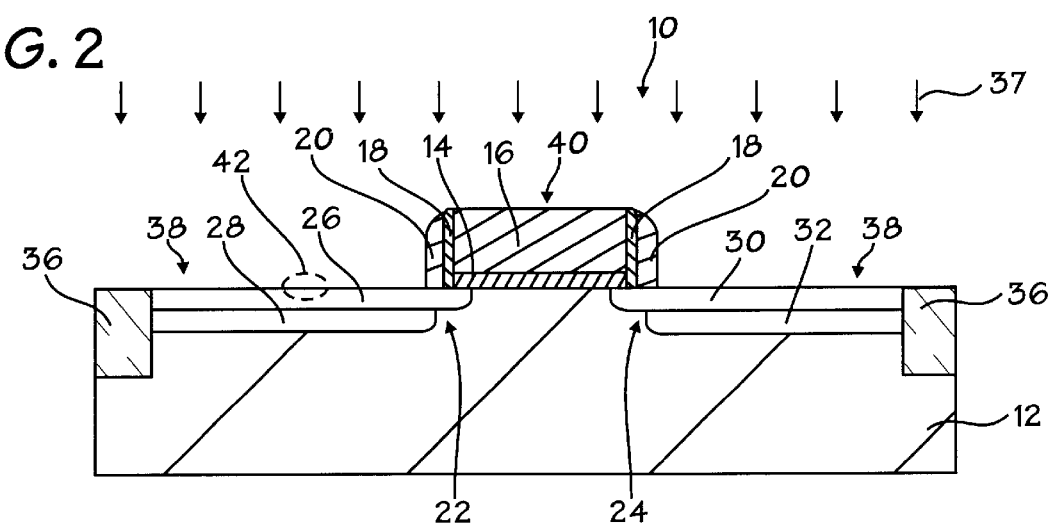
FIG. 2 is a cross-sectional view of the substrate of FIG. 1 depicting fabrication of the transistor device and pre-silicidation substrate surface roughening in accordance with the present invention.
Figure 3:
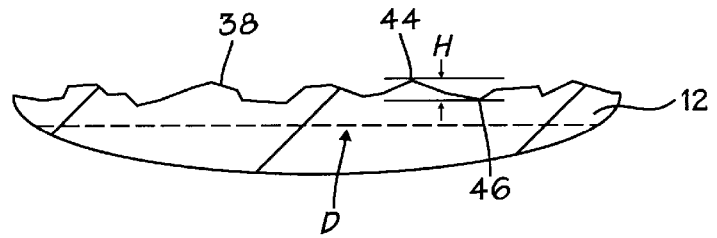
FIG. 3 is a magnified view of a portion of FIG. 2 in accordance with the present invention.
Figure 4:
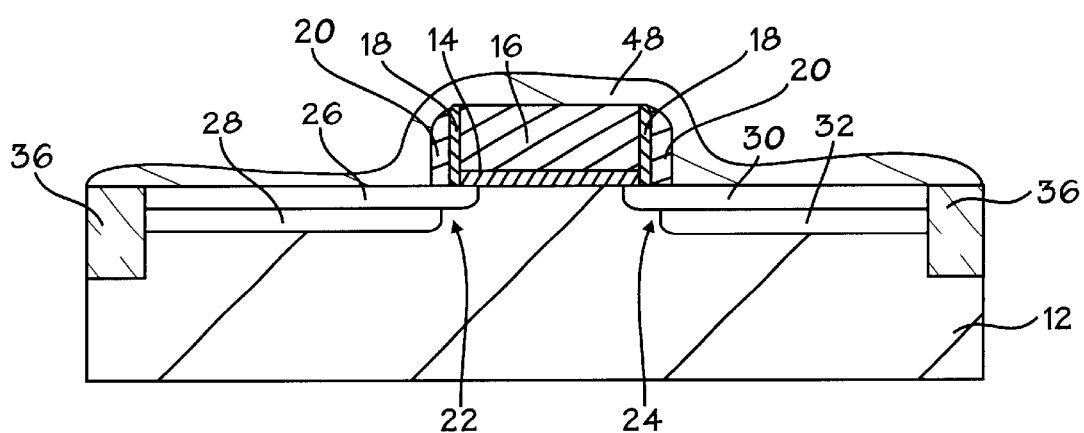
FIG. 4 is a cross-sectional view like FIG. 2 depicting deposition of a silicide-forming material on the substrate in accordance with the present invention.

An exemplary method for fabricating the transistor 10 including the silicide film 34 in accordance with the present invention may be understood by referring now to FIGS. 2, 3 and 4 and initially to FIGS. 2 and 3. The transistor 10 may be fabricated using well-known techniques and materials for semiconductor device fabrication. It should be understood that the transistor 10 may be implemented as a field effect transistor as shown, or, optionally as any of a myriad of other types of circuit devices that may benefit from ohmic contact improvement through salicidation. For the purpose of illustration, the process will be described in the context of a n-channel device.

The isolation structures 36 may be shallow trench isolation, field oxide, or other isolation structures. In an exemplary embodiment, the structures 36 are shallow trench isolation structures and may be composed of silicon dioxide, silicon nitride or other suitable isolation materials, and may be formed using well-known damascene etching and fill techniques.

The gate insulating or dielectric layer 14 is formed on the substrate 12 by oxidation, blanket CVD or the like. As used herein, the terms "formed on," "disposed on" or "positioned on" should be construed to include the possibility that a given layer or structure may be formed on another given layer or structure with a third or other intervening layers or structures disposed between the two. The layer 14 is advantageously composed of suitable gate dielectric materials, such as, for example, silicon dioxide, silicon nitride, $Ta_2O_5$, laminates of these or the like. In an exemplary embodiment, the layer 14 is composed of silicon dioxide formed by thermal oxidation to a thickness of about 15 to 50 Å. A rapid thermal anneal ("RTA") with an oxygen containing ambient at about 800 to 1050° C. for about 10 to 30 seconds may be used. Optionally, a furnace process may be used for about 10 to 30 minutes.

The gate electrode 16 is fabricated by initially depositing a layer of conducting material on the gate insulating layer 14 and subsequently patterning the layer into the desired shape for the gate 16 by etching. The gate electrode 16 may be composed of a variety of conducting materials, such as, for example, polysilicon, amorphous silicon, aluminum, tantalum or the like. In an exemplary embodiment, the gate electrode 16 is composed of polysilicon. Well-known techniques for applying polysilicon, such as CVD, may be used to deposit the gate electrode 16. In an exemplary embodiment, the polysilicon is deposited at or above about 625° C. to a thickness of about 750 to 2000 Å. Reactive ion etching ("RIE"), chemical plasma etching or the like may be used in conjunction with a variety of etchant species suitable for anisotropically etching polysilicon, such as, for example, $CF_4/O_2$. The width of the gate electrode 16 will typically be the minimum feature size available with the prevailing lithographic patterning system, although larger geometries are possible. Later implants for the source\drain regions 22 and 24 will render the gate electrode 16 conductive. S Optionally, the gate 16 may be supplied with impurities prior to etch definition.

The first set of sidewall spacers 18 is fabricated to provide an initial lateral separation between the edges of the gate electrode 16 and the later-formed source/drain extensions. Fabrication may be by oxidation of the gate sidewalls or by blanket deposition of a variety of suitable dielectric sidewall spacer materials, such as, for example, silicon nitride, silicon dioxide, silicon oxynitride or the like. In an exemplary embodiment, the spacers 18 are composed of oxide fabricated by blanket deposition using low pressure or plasma enhanced CVD to a thickness of about 100 to 300 Å followed by an anisotropic etch selective to the substrate 12 to yield the completed spacers 18. Again, the etch may be by RIE, chemical plasma etching, or other suitable anisotropic etching techniques utilizing a chemistry suitable for anisotropically etching oxide, such as $CF_4$.

The source/drain regions 22 and 24 may be established by ion implantation or diffusion, and may be single or multi-graded as desired. In the illustrated embodiment, the source/drain regions 22 and 24 are multi-graded and established by ion implantation. Initially, an implant is performed to establish the source/drain extensions 26 and 30 self-aligned to the gate electrode 16. A variety of n-type impurity species 37 may be used, such as, for example, arsenic, phosphorus or the like. In an exemplary embodiment, arsenic may be implanted with an energy of about 5 to 30 keV and a dosage of about 5E14 to 3E15 $cm^{-2}$. The implant may be on or off-axis as desired. The relatively low implant energy establishes initially shallow junctions for the extensions 26 and 30.

The sidewall spacers 20 are fabricated in anticipation of an additional source/drain implant. Again, oxidation formation or blanket deposition of a variety of suitable dielectric sidewall spacer materials, such as, for example, silicon nitride, silicon dioxide, silicon oxynitride or the like. In an exemplary embodiment, the spacers 20 are composed of silicon nitride and may be fabricated by blanket deposition using low pressure or plasma enhanced CVD to a thickness of about 100 to 1500 Å followed by an anisotropic etch selective to the substrate 12 to yield the completed spacers 20. Again, the etch may be by RIE, chemical plasma etching, or other suitable anisotropic etching techniques utilizing a chemistry suitable for anisotropically etching silicon nitride, such as $CF_4/O_2$.

A second implant is performed to form the overlapping impurity regions 28 and 32 of the source/drain regions 22 and 24 using a n-type dopant specie 37 of the type described above. In an exemplary embodiment, arsenic is implanted with a dosage of about 1E15 to 1E16 $cm^{-2}$ and an energy of about 10 to 40 keV. The implant may again be on or off-axis. Activation of the source/drain regions 22 and 24 may be by RTA at about 900 to 1100° C. for about 10 to 60 seconds.

Prior to salicidation, the upper surface 38 of the substrate 12 and the upper surface 40 of the gate electrode 16 undergo a pretreatment process. The goal of the pretreatment is to roughen the upper surfaces 38 and 40 so that their respective surface areas are increased beyond that ordinarily provided through conventional salicidation. As shown in FIG. 3, which is a magnified view of a small portion of FIG. 2 circumscribed generally by the dashed oval 42, the upper surface 38 is roughened so that the orderly lattice structure of the substrate 12 is disrupted down to a depth D and an average peak-to-trough height H. The average peak-to-trough height H is the average height H between the peaks 44 and troughs 46 for the surface topography. The regions between adjacent peaks 44 define a plurality of oblique surfaces 47. The values for the depth of roughening and the average peak-to-trough height H are largely matters of design discretion. In an exemplary embodiment, the depth D is about 200 Å and the average peak-to-trough height H is about 300 Å.

The surface 38 is advantageously roughened by performing a plasma etch. In an exemplary embodiment, a fluorocarbon etch specie, such as, for example, $CF_4$, $CHF_3$, $C_3F_8$, combinations of these or the like are used to bombard the surface 38 in a plasma ambient. The etch parameters are tailored to attack the surface 38 directionally. Purely isotropic or anisotropic etching will generally yield relatively smooth surfaces. Etching somewhere between isotropic and anisotropic conditions will yield a relatively rougher surface. Implant damage in the source/drain regions 22 and 24 and the grain structure of the polysilicon gate 16 will facilitate the roughening. Accordingly, the plasma etch is advantageously performed at conditions favoring anisotropic but not completely anisotropic etching to provide a better surface roughness, that is, larger oblique surfaces 47 and an average peak-to-trough height H than a purely anisotropic etch. The substrate 12 may be biased if desired although it is anticipated that a little or no substrate bias may be used. An exemplary etch treatment process is given by the following table:

| | |
|---|---|
| Temperature | about 20° C. |
| Pressure | about 55 to 200 millitorr |
| High Frequency Power (rf @ 13.56 MHz) | about 100 to 500 watts |
| Magnetic Flux Density | about 20 to 40 gauss |
| $CF_4$ Flow Rate | about 5 to 40 sccm |
| $Cl_2$ Flow Rate | about 20 to 40 sccm |
| He Flow Rate | about 12 to 16 sccm |
| $O_2$ Flow Rate | about 4 to 8 sccm |
| Substrate Bias? | No |
| Treatment Time | about 10 to 12 seconds |

The helium and oxygen are included primarily for backside cooling of the substrate 12. The oxygen further serves to scavenge hydrogen that may be present in the etch chamber.

Referring now to FIG. 4, a metal layer 48 is blanket deposited on the substrate 12. The metal layer 48 may be composed of a cobalt-containing material, such as relatively pure cobalt or cobalt combined with a small amount of another constituent or constituents, such as platinum or the like. Optionally, the layer 48 may be composed of other metallic materials suitable for silicide formation, such as, for example, platinum, palladium, nickel, tungsten, tantalum, molybdenum or the like. In an exemplary embodiment, the layer 48 is composed of relatively pure cobalt and may be deposited by physical vapor deposition ("PVD") to a thickness of about 50 to 300 Å.

The substrate 12 and the metal layer 48 are heated to initiate a silicide-forming reaction. The heating step may be performed at about 400 to 600° C. for about 30 to 120 seconds in an RTA with an inert ambient of argon or nitrogen. This first heating step establishes the silicide layer 34 on the source/drain regions 22 and 24 and the gate electrode 16. As the silicide reaction is consumptive of silicon and polysilicon, the layer 34 partially invades the source/drain regions 22 and 24 and the gate electrode 16 as shown in FIG. 1. The silicide reaction will not occur at the gate 16 where the gate 16 is composed of a material other than amorphous or polycrystalline silicon.

Any unreacted metal remaining after the silicide reaction is removed by wet etching. For example, a HCl-peroxide dip with about a 3:1 ratio by volume, or a $H_2SO_4$-peroxide dip with about a 3:1 ratio by volume may be used.

A second anneal is performed to transform the silicide layer 34 into a final low ohmic phase. In an exemplary embodiment wherein the silicide layer 34 is composed substantially of cobalt silicide, the second anneal step may be performed at about 600 to 900° C. for about 10 to 60 seconds in an RTA process.

The plasma pre-treatment yields a roughened silicon or polysilicon surface with a greater surface area than a conventionally processed substrate. Silicide formation is more aggressive, resulting in thicker, less resistive films.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a silicide film, comprising:
   providing a silicon surface;
   etching the silicon surface at between isotropic and anisotropic etching conditions to define a plurality of oblique surfaces thereon and thereby increase the surface area of the silicon surface;
   depositing a silicide-forming material on the plurality of oblique surfaces; and
   heating the silicon surface to react the silicide-forming material therewith and form silicide.

2. The method of claim 1, wherein the silicon surface comprises a silicon substrate.

3. The method of claim 2, comprising forming an impurity region in the substrate and forming the silicide film on the impurity region.

4. The method of claim 1, wherein the silicon surface comprises a gate electrode.

5. The method of claim 1, wherein the gate electrode comprises polysilicon.

6. The method of claim 1, wherein the etching comprises plasma etching.

7. The method of claim 6, wherein the plasma comprises $CF_4$.

8. The method of claim 1, wherein the silicide-forming material comprises cobalt.

9. A method of fabricating a circuit device, comprising:
   providing a silicon surface;
   forming a gate electrode stack on the silicon surface;
   forming sidewall spacers adjacent to the gate electrode stack;
   etching the silicon surface at between isotropic and anisotropic etching conditions to define a plurality of oblique surfaces thereon and thereby increase the surface area of the silicon surface;
   depositing a silicide-forming material on the plurality of oblique surfaces; and
   heating the silicon surface to react the silicide-forming material therewith and form silicide.

10. The method of claim 9, comprising forming an impurity region in the silicon surface adjacent to the gate electrode stack and forming the silicide film on the impurity region.

11. The method of claim 10, wherein the gate electrode stack comprises a polysilicon gate electrode.

12. The method of claim 11, wherein the silicide-forming material is deposited on the gate electrode.

13. The method of claim 9, wherein the etching comprises plasma etching.

14. The method of claim 13, wherein the plasma comprises $CF_4$.

15. The method of claim 9, wherein the silicide-forming material comprises cobalt.

16. A method of fabricating a circuit device, comprising:
   providing a silicon surface;
   forming a gate electrode stack on the silicon surface;
   forming a first pair of sidewall spacers adjacent to the gate electrode stack;
   forming a second pair of sidewall spacers adjacent to the first pair of sidewall spacers;
   etching the silicon surface at between isotropic and anisotropic etching conditions to define a plurality of oblique surfaces thereon and thereby increase the surface area of the silicon surface;
   depositing a silicide-forming material on the plurality of oblique surfaces; and
   heating the silicon surface to react the silicide-forming material therewith and form silicide.

17. The method of claim 16, comprising forming an impurity region in the silicon surface adjacent to the gate electrode stack and forming the silicide film on the impurity region.

18. The method of claim 16, wherein the gate electrode stack comprises a polysilicon gate electrode.

19. The method of claim 18, wherein the silicide-forming material is deposited on the gate electrode.

20. The method of claim 16, wherein the etching comprises plasma etching.

21. The method of claim 20 wherein the plasma comprises $CF_4$.

22. The method of claim 16, wherein the silicide-forming material comprises cobalt.

* * * * *